April 4, 1967 J. T. WALLMARK 3,312,838

SEMICONDUCTOR RECTIFYING DEVICE WITH A PLURALITY OF JUNCTIONS

Filed April 27, 1964 2 Sheets-Sheet 1

INVENTOR.

JOHN T. WALLMARK

BY Eugene M. Whitacre

Attorney

INVENTOR.
JOHN T. WALLMARK
BY Eugene M. Whitacre
Attorney 3,312,838

SEMICONDUCTOR RECTIFYING DEVICE WITH A PLURALITY OF JUNCTIONS

John T. Wallmark, Princeton, N.J., assignor to Radio Corporation of America, a corporation of Delaware Filed Apr. 27, 1964, Ser. No. 362,846
4 Claims. (Cl. 307—88.5)

This invention relates to semiconductor devices and more particularly to semiconductor rectifying devices.

A semiconductor device in accordance with the present invention comprises an integral unit including a plurality of junctions formed on a common semi-conductor base. The impurity doping of the various regions is selectively controlled to produce a plurality of junctions with predetermined dissimilar reverse bias junction breakdown voltages and saturation currents.

The novel features which are considered to be characteristic of this invention are set forth in particularity in the appended claims. The invention itself, however, both as to its organization and method of operation will be best understood when read in connection with the accompanying drawings in which:

Figure 1:
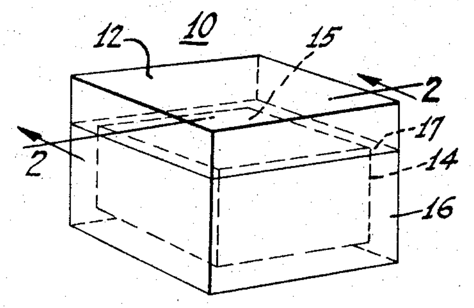
FIGURE 1 is a perspective view of a semiconductor rectifier embodying the invention.

Referring to the drawing, like elements and parts are designated by like reference characters throughout the figures. The semiconductor device embodying the invention includes in the present example a single anode diode formed with a double cathode. The separate diode cathode regions are formed with different amounts of impurity concentrations to provide dissimilar reverse current-voltage characteristics for each diode section. The polarity of conductivity of the diode regions can also be reversed to produce a device with a double anode formed with a single cathode crystal should an opposite conductivity type diode be desired. This reversal is accomplished by simply reversing the conductivity (donor-acceptor) of the semiconductor regions created by the preparation process (referred to in a later portion of the specification).

Figure 2:
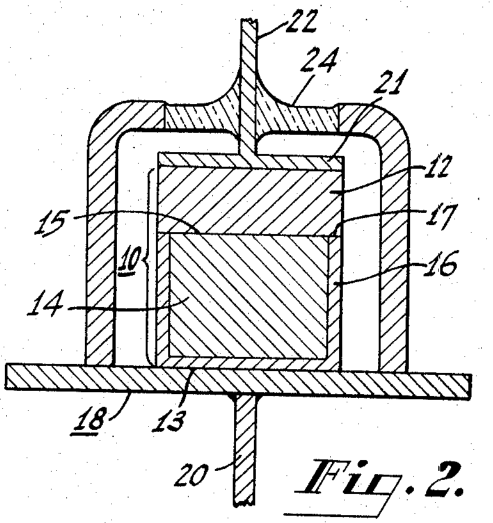
FIGURE 2 is a sectional view of a semiconductor device taken on section lines 2—2 of FIGURE 1 shown enclosed in a case with leads attached.

As shown in FIGURES 1 and 2, the semiconductor device 10 is a double diode circuit element comprising three separate semiconductor regions 12, 14 and 16, with two regions, 14 and 16, forming two separate rectifying junctions with a third common region 12. The region 12 in the present example is of a P or acceptor type low resistivity semiconductor material.

The main or primary diode 15 is formed by the junction of the high resistivity N or donor type semiconductor material or region 14 with the common P type region 12. The auxiliary or secondary diode 17 is formed by the junction of a thin peripheral shell or surface region of the N or donor semiconductor region 16 with the common P type region 12. The resistivity of the region 16 is lower than region 14 but higher than region 12. As shown in FIGURES 1 and 2 the thin peripheral surface region 16 completely surrounds and encompasses the region 14 except for the portion forming a junction with region 12. The regions 14 and 16 comprise the double cathode elements abutting the common anode region 12.

FIGURE 2 shows the semiconductor device 10 of FIGURE 1 enclosed in a standard cylindrical diode type case 18 which also serves as a heat sink. The case 18 in the present example is soldered to a surface 13 (of the peripheral semiconductor shell 16) opposite that of the junction surfaces to provide an ohmic contact to the cathode portions of the device 10. Since the regions 14 and 16 are of the same conductivity type, they are effectively connected in parallel. If desired, the bottom surface 13 may be removed and a direct contact to regions 16 and 14 provided by soldering the case 18 directly to both regions. Lead 20 is welded to the metal contact or case 18 and provides for a means of connecting the cathode portions 14 and 16 of the semiconductor device 10 to an external circuit. A metal contact 21 and its connected lead 22 are soldered to the anode region 12 to provide a means of connecting the anode region to an external circuit. Lead 22 is held rigidly in place and insulated from the case 18 by a glass bead 24.

The semiconductor device 10 of the present example is prepared by using a high resistivity (100 ohm cm.) phosphorus type impurity doped N type wafer as a base region. This base region provides the primary diode cathode region 14 into which regions 12 and 16 are diffused. The P type region 12 is diffused into the high resistivity N type base region by heating the wafer at 925° C. for three hours in a reducing atmosphere of forming gas (combination of nitrogen and hydrogen) mixed with boron type impurities. This process will produce the heavily doped P type region 12 having a resistivity in the order of $1\times10^{-3}$ ohm cm. over the entire surface of the N type wafer. The resulting structure is then sliced by dicing or ultrasonic machining into cubes approximately one-half millimeter in size similar to the device shown in FIGURE 1. At this stage of the process, the region 14 extends to the edges of the cubes to contempletely encompass region 16. The cubes containing the rectifying junction (between regions 12 and 14) are then heated at 900° C. for approximately one hour in a reducing atmosphere of forming gas mixed with a phosphorus type impurity. This second diffusion process produces a thin peripheral shell or surface region 16 in the entire outer surface of the N type region 14 (except the portion forming a junction with the region 12). The region 16 has a resistivity in the order of ½ ohm cm. The effect of this diffusion upon the P type region 12 is negligible. The end result of this process produces the semiconductor device 10 of FIGURE 1. The resistivity of the various regions can be varied to produce a variety of desired characteristics in the device 10. In the prevent embodiment of the device it is preferable that the resistivity of region 16 is at least ten times that of region 12, while region 14 is at least one hundred times that of region 12.

Figure 3:
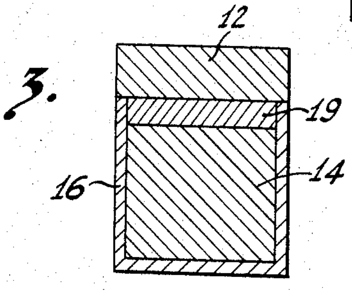
FIGURE 3 is a sectional view of a modification of the semiconductor device of FIGURE 1.

The semiconductor device 10 of FIGURE 1 can be modified by an added step in the preparation process to include an additional intrinsic region 19 as shown in FIGURE 3. This modification achieves a high saturation current ($I_s$) at low reverse bias between the regions 14 and 12 that does not vary appreciably with increasing reverse bias. The preparation of the intrinsic type diode may be accomplished by an additional initial step prior to processing the N type wafer in the above-mentioned manner. This additional step consists of heating the high resistivity N type wafer at 900° C. for ½ hour in a reducing atmosphere of forming gas mixed with a small amount of boron type impurities followed by heating to 925° C. for 1 hour in an atmosphere of only forming gas. This step diffuses into the entire surface of the wafer an intrinsic shell having a resistivity in the order of 1000 ohm cm. The remainder of the preparation process will encompass all the above previously mentioned steps.

By exposing the modified N type base wafer (with the formed intrinsic type shell) to the P type reducing atmosphere (the first step in the previously-mentioned process) a P type region 12 is diffused into the outer portion of the intrinsic shell. The difference between the diffusion depth of the intrinsic shell and that of the P type region 12 forms the intrinsic region 19 (FIGURE 3). The resulting structure, a base wafer with an N type core (region 14) surrounded by an intermediate intrinsic region 19 and an outer P type region 12, is sliced into cubes, each cube containing a portion of each region. At this stage of the process, the cross-section of a cube resembles that of FIGURE 3 with regions 19 and 14 extending outward to include the region 16.

The cubes containing the intrinsic type rectifying junction (regions 12, 19 and 14) are then exposed to the forming gas mixture used in creating region 16 (the last step in the previously mentioned procedure). This final step of the process produces the thin peripheral shell or surface 16 in the entire outer surface of the N type region 14 and the intrinsic region 19 (except for the portions forming the junction with region 12) thereby creating the modified semiconductor device 10 of FIGURE 3.

In FIGURES 1 and 2 the junction of the two low resistivity regions 16 and 12 produces a diode 17 having a low initial ambient temperature reverse bias saturation current ($I_s$) with a corresponding low reverse voltage avalanche breakdown characteristic in the order of 15–100 v. D.C. (volts direct current). On the other hand, the junction of the high resistivity region 14 with the low resistivity region 12 produces a diode 15 with a high initial ambient temperature reverse bias saturation current ($I_s$) per unit area (approximately 30 times that of diode 17) with a reverse voltage avalanche breakdown characteristic in the order of 1000 v. D.C. The diode of FIGURE 3 has similar characteristics with an added advantage of a higher initial ambient temperature saturation current per unit area due to the additional intrinsic region. The function of these characteristics will best be understood by reference to a circuit application of the device 10 as shown in FIGURE 4.

Figure 4:
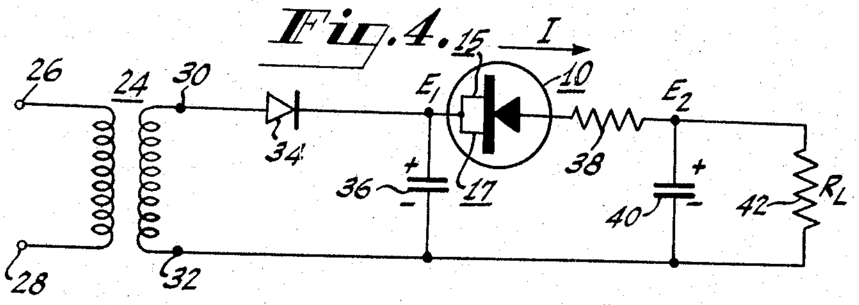
FIGURE 4 is a schematic circuit diagram of a power supply including the semiconductor device of FIGURE 1.

The semiconductor device 10 of FIGURES 1 and 2 is schematically represented in FIGURE 4 by the double diodes 15 and 17 formed with a common anode region. FIGURE 4 is an illustration of a standard type power supply circuit using the semiconductor device 10 as a diode filter. The A.-C. input power is transformer coupled to the rectifying circuit through a power transformer 24, the primary terminals 26 and 28 being connected to the source of power and the secondary terminals 30 and 32 being connected to the rectifying circuit. The output from the transformer is rectified by a diode 34 which in turn is connected to the power supply filter circuit. The power supply filter circuit of the present example comprises an input capacitor 36 connected in parallel with the combined transformer and rectifying circuit, the series semiconductor device 10 connected for reverse current flow, a series resistor 38 and an output capacitor 40 connected in parallel with a resistor 42. Resistor 42 is labelled $R_L$ and represents the connected load. The resistor 38 serves to eliminate any oscillating conditions that might otherwise tend to occur in the filter circuit.

In the present example, the rectified voltage $E_1$ of FIGURE 4 is greater than the avalanche breakdown voltage of the auxiliary diode 17, but less than that of the main diode 15. The application of the voltage across the semiconductor device 10 results in the avalanche breakdown of the auxiliary anode 17, causing a high current to flow, thereby heating both the common anode region 12 and the physically connected region 14. This heating effect in turn reduces the peak inverse voltage of the main diode 15 which, through a regenerative effect, reaches a high current operation point at an elevated temperature. Once the high current main diode 15 breaks down, it takes control effectively by-passing the total diode current around the auxiliary diode 17.

Figures 6, 7:
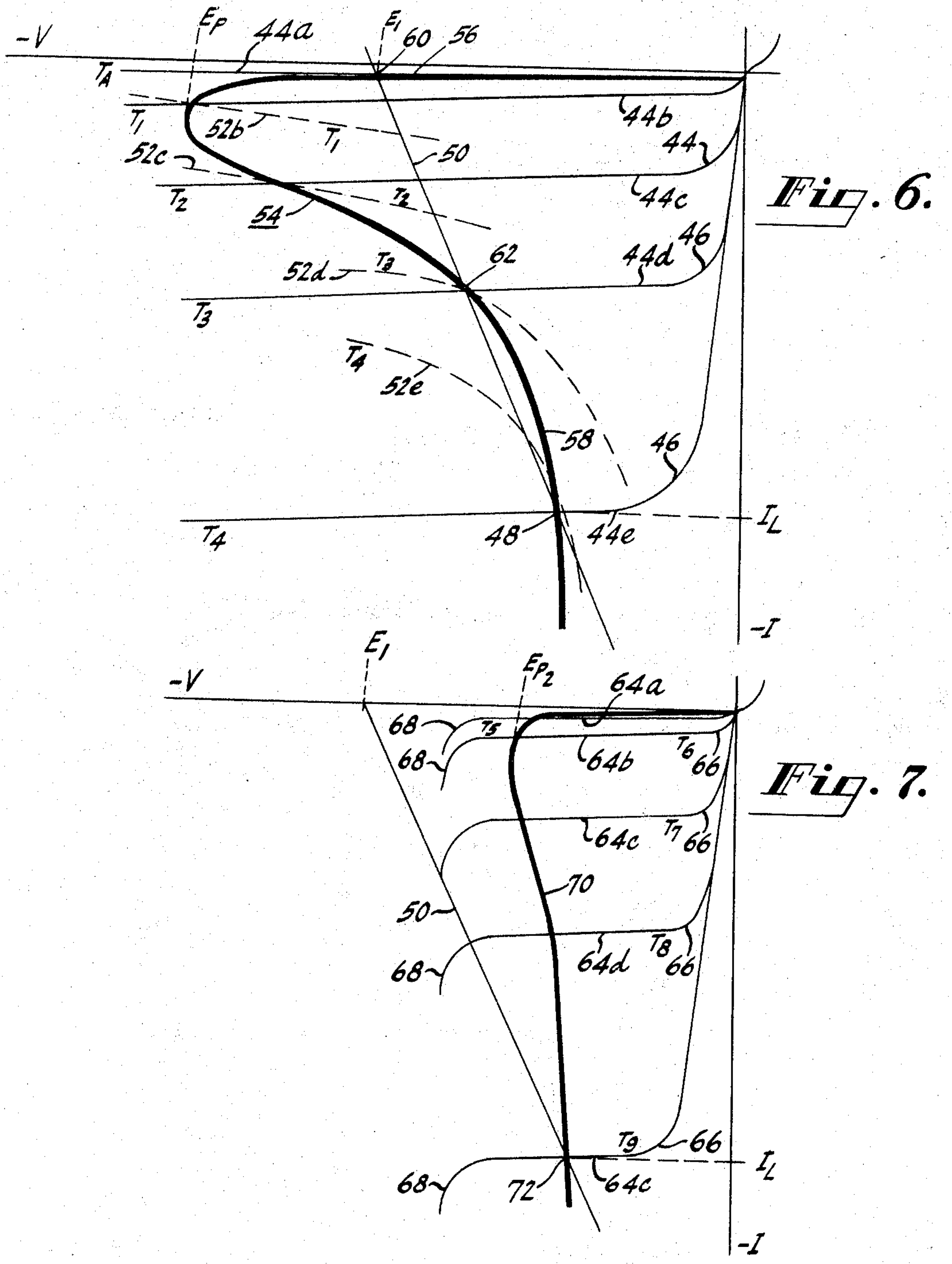
FIGURE 6 is a graphic representation of the interrelation of the voltage, current and temperature as applied to one rectifying junction of FIGURE 1.
FIGURE 7 is a graphic representation of the interrelation of the voltage, current and temperature as applied to the other rectifying junction of the semiconductor device of FIGURE 1.

Accordingly, since the main diode 15 effectively bypasses the auxiliary diode 17, the operation of the filter circuit and more particularly the operation of the semiconductor device 10 will be better understood by referring to the operation of the diode 15 alone, and then later studying the operation of the combined double diode structure. FIGURE 6 is a graphic respresentation of the inter-relation of the reverse voltage, reverse current and temperature as applied to the rectifying junction of the main diode 15. The curves *44a*, *44b*, *44c*, *44d* and *44e* of FIGURE 4 represent the isothermal reverse voltage-current characteristic of the diode 15 junction at several different temperatures.

The curve *44a* is the reverse voltage-current curve for diode 15 at an ambient junction temperature while the curves *44b–44e* represent the reverse voltage-current curves at progressively increasing junction temperatures. The diode reverse current is strongly dependent on temperature. The reverse current of a typical silicon diode varies exponentially with temperature and is approximately doubled every 8° C., whereby large changes of reverse current are observed for a correspondingly small change in junction temperature. In certain applications a germanium diode or gallium arsenide diode, or any other semiconductor diode, may be used, as well as a silicon diode.

The isothermal curves *44a–44e* display a knee 46 at relatively low reverse voltages. For a range of reverse voltages beyond the knee 46, the diode 15 reverse current is substantially independent of the voltage across the diode until its reverse avalanche breakdown voltage is exceeded (not shown in FIGURE 6). As a result, the current through the diode 15, while operating on the flat portion of the isothermal curve (point 48), is substantially independent of the ripple of the applied voltage ($E_1$). The isothermal curves *44a–44e* are not exactly flat, but rather slope as a function of applied voltage, and vary from one type of diode to another. The more nearly the slope of the isothermal curves *44a–44e* parallels the abscissa (voltage axis) at the operating point of the diode, the greater the dynamic impedance will be.

The total reverse current through diode 15 can be approximately represented as being made up of two components, a saturation current $I_s$ and a leakage current $I_1$. The leakage current $I_1$ is due to imperfections in the junction and in many cases is designed to a negligible value and therefore can be ignored. The junction saturation current $I_s$ is of primary interest because of its temperature sensitivity.

Figure 5:
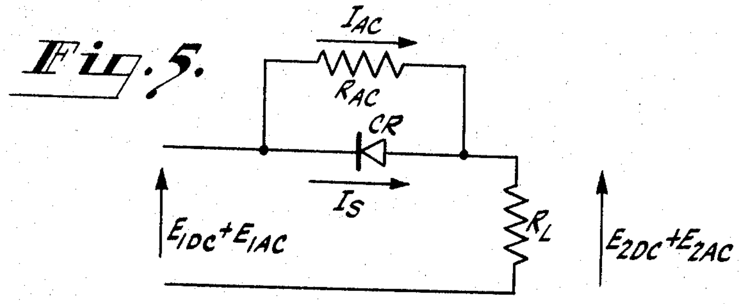
FIGURE 5 is an equivalent circuit of a portion of the semiconductor device of FIGURE 1.

The slope in the isothermal curves *44a–44e* beyond the knee 46 is a result of an increasing junction depletion region due to the increasing magnitude of the applied voltage. Although the slope may not always be linear, for practical purposes the effect of the increased junction depletion region and corresponding increase in current can be approximated by a linear resistor $R_{ac}$ connected across the perfect diode CR as shown in FIGURE 5, the equivalent circuit of diode 15. The slope of the isothermal lines *44a–44e* is a good approximation of the conductance value ($1/R_{ac}$) of the resistor $R_{ac}$. The magnitude of ripple current that passes through the diode is a direct function of the slope of the isothermal lines *44a–44e*, and, therefore, all the ripple current ($I_{ac}$) in the equivalent circuit (FIGURE 5) can be represented as flowing through $R_{ac}$ only. The D.-C. component of current can thereby be represented as flowing through the perfect diode CR. The diode CR has a constant voltage drop depending upon its operation point along the respective isothermal curve.

$E_{1dc}+E_{1ac}$ of FIGURE 5 is the rectified D.C. and ripple components respectively as applied to the anode of the diode 15. The output of the diode is applied across the load $R_L$ and is designated by $E_{2dc}+E_{2ac}$ which constitutes the D.-C. output voltage and the output ripple component respectively. Since all the ripple current ($I_{ac}$) flows through $R_{ac}$, the ripple action of the equivalent circuit can be approximated by the ratio $$\frac{E_{2ac}}{E_{1ac}}=\frac{R_L}{R_{ac}+R_L}$$

The effective inductance of the filter diode is found by substituting $\omega L_{eff}$ (effective inductance) for $R_{ac}$ whereby $$L_{eff}=\frac{R_L}{\omega}\left(\frac{E_{1ac}}{E_{2ac}}-1\right)$$

Though the effective inductance ($L_{eff}$) may not be constant for variations in voltage level or frequency, the effective inductance is a measure of the inductive qualities of the diode filter. The diode effective inductance, when specified along with the diode effective D.C. resistance and the load current, is a convenient means for expressing the efficiency of the effective filter action.

The diode 15 exhibits a high dynamic impedance if the static or D.C. operation point is located at a point where the dynamic action of the diode remains on the constant current portion of the isothermal curve and the current flow still meets the power requirements of the load. In the present example, point 48 has been selected as the operating point designated by the required load current $I_L$ and a minimum D.-C. voltage drop across the diode. The load line 50 is projected through the operating point 48 to represent the circuit operation conditions. As the voltage $E_1$ varies due to its ripple component, the corresponding load line shifts to the left and right about its position shown in FIGURE 6. As the voltage $E_1$ approaches a peak value, the corresponding load line as viewed in FIGURE 6 shifts to the left in parallel relation to the position as shown, and as $E_1$ approaches the minimum value the load line shifts to the right. This shifting or oscillating of the load line about the operating point 48 over the constant current portion of the isothermal curve 44e produces very little change in the load current ($I_L$). As long as the ripple voltage variations do not result in shifting the load line beyond the knee 46 of the respective isothermal curve, the diode has an effective high dynamic impedance (A.-C.) impedance (to the ripple voltage and a much lower D.-C. resistance.

The particular diode that can be applied to a given application is determined by the magnitude of the required load current, its thermal dissipation time constant and the temperature to which the diode junction must be raised to pass the required load current. The diode thermal time constant should be large compared to the frequency of the applied ripple so that the voltage excursions will not excessively vary the stabilized junction operation temperature. Since an excessive temperature will destroy the semiconductor junction, the junction temperature is a limiting operational factor. The reverse saturation current ($I_S$) at ambient temperature may be used to estimate the maximum current carrying capabilities of the particular diode at its limiting junction temperature. For an increased junction operating temperature between 150 to 300° C., the operating reverse currents have been calculated to be as high as $10^6$ to $10^{12}$ times that at ambient temperature.

The magnitude of the ambient temperature reverse saturation current ($I_S$) per unit area is a direct function of the size of the junction depletion region. The saturation current is created by the thermally generated hole-electron pairs which are separated by the junction of a P or acceptor type semiconductor material with an N or donor type semiconductor material. A wide depletion region is created in main diode 15 by a sufficiently low doping concentration in the low impurity doped region 14. The wide depletion region of diode 15 (higher initial thermally generated current) has the advantage of being capable of operation at a lower temperature for a given load requirement than that of a diode with a corresponding area but a narrower depletion region. The lower operating temperature is important if stability and long life is to be obtained.

In the present example, in order to pass the required load current ($I_L$) and operate on the isothermal curve 44e (FIGURE 6), the diode 15 rectifying junction must be raised to the temperature $T_4$. This temperature may be reached by exceeding either the junction avalanche breakdown voltage or the peak inverse voltage. Both breakdown conditions may be created by the application of a reverse voltage exceeding the respective limits, while the peak inverse breakdown may also be exceeded by applying a given voltage less than the breakdown value along with the application of external heat.

In FIGURE 6 the dashed lines 52b–52e are hyperbolas of constant power dissipation using increments of power that are assumed to be proportional (through Newton's Law of Cooling) to the increments of temperature used in laying out the isothermal curves 44b–44e. A thermal equilibrium characteristic for the designated ambient temperature can be plotted by connecting the intersections of the isothermal curves 44b–44e and the respective constant power hyperbolas 52b–52e. The thermal equilibrium characteristic is illustrated in FIGURE 6 as a heavy line 54. The thermal equilibrium characteristic exhibits a region of a positive resistance slope 56 having a substantially constant low current for a wide range of applied voltage until the voltage $E_p$ is exceeded. When this voltage ($E_p$) is exceeded, the thermal equilibrium characteristic 54 then exhibits a negative resistance slope 58.

The thermal equilibrium characteristic 54 of FIGURE 6 represents a locus of operating points after the diode 15 has stabilized over a period of time. If the ambient temperature is changed, the thermal equilibrium curve assumes a new shape. An increase in ambient temperature causes the peak inverse voltage ($E_p$) to decrease (move to right in FIGURE 6). As the diode 15 is inserted in the circuit of FIGURE 2 with a corresponding load line 50 representing the load $R_L$, the applied voltage ($E_1$) is less than the peak inverse voltage ($E_p$) (as shown in FIGURE 6), the diode 15 operates at point 60 where the load line 50 intersects the positive resistance slope 56. Under these conditions, the diode 15 can be heated to cause operation at point 48. The application of heat to the diode reduces the peak inverse voltage ($E_p$) to a point where the applied voltage ($E_1$) exceeds it. Once the peak inverse voltage ($E_p$) is exceeded, the internal heat created by the increased current flow causes a regenerative type effect thereby causing the diode to operate at point 48 when the diode has reached thermal stability with the ambient temperature. The intersection of load line 50 with the thermal equilibrium characteristic 54 at point 62 is an unstable point of operation and therefore the circuit does not stably operate at that point.

As previously mentioned, for a required value of load current ($I_L$), it is desired to have as wide a depletion region as possible so that the temperature to which the diode junction must be raised to pass the required reverse current can be minimized. However, the peak inverse voltage ($E_p$) of the diode junction also increases with an increased width of the depletion region (the peak inverse voltage $E_p$ moves to the left in FIGURE 6). The avalanche breakdown voltage is also a direct function of the width of the depletion region. The avalanche breakdown is caused by a very high field created across the depletion region. This high field causes the depletion region hole and electron pair transport to increase in velocity, which in turn results in an increased number of collisions, thus further increasing the carrier current.

If a sufficiently high field is created across the depletion region the electron collisions reach a point at which the avalanche breakdown takes effect. With a wider depletion region, a higher voltage must be placed across the diode junction to create the necessary field to produce the avalanche breakdown.

FIGURE 7 is a graphic representation of the interrelation of the voltage, current and temperature as applied to diode 17 plotted on the same scale as that of the graphic representation of FIGURE 6. As previously mentioned, the auxiliary diode 17 is a narrow depletion region diode created by the junction of two high impurity doped regions 12 and 16. Furthermore, the diffusion process used in creating region 16 created a thin surface layer producing a very small junction area as shown in FIGURE 1. The combination of the narrow depletion region and the small junction area created a diode with a very low ambient reverse saturation current as compared to the main diode 15. In the particular example, the reverse current of the diode 17 at ambient temperatures is less than 1/30 per unit area of the reverse current of diode 15 and therefore cannot be effectively plotted in FIGURE 7. As a result the reverse current curves **64*a* through 64*e* of FIGURE 7 represent the reverse currents of diode 17 at temperatures above ambient temperature. The isothermal curves 64*a*–64*e* display a knee 66 at relatively low voltages and an avalanche breakdown point 68 at somewhat higher voltages. Since diode 17 is a narrow depletion region diode, the field that must be created across the depletion region to create the avalanche type breakdown is far less than that of diode 15** and in the present example is less than the applied voltage $E_1$.

Since the main function of the auxiliary diode 17 is to cause a breakdown in diode 15 by heating the common region 12 and the physically connected main diode region 14, the slope of the isothermal curves **64*a*–64*e* is not an important factor. The isothermal equilibrium characteristic for diode 15 is shown in FIGURE 7 by the heavy line 70 and is plotted in the same manner as mentioned above in connection with diode 15** and FIGURE 7.

As shown in FIGURE 7, the applied voltage $E_1$ exceeds both the avalanche voltage and the peak inverse voltage of the auxiliary diode 17. The application of the voltage to diode 17 causes an avalanche breakdown resulting in a regenerative type effect as previously mentioned in connection with the breakdown of diode 15. The breakdown of diode 17 results in an increasing current heating the junction which in turn further increases the reverse current. If the diode 17 was connected into the circuit alone, the diode would reach an equilibrium point 72 at the common intersection of the load line 50, the thermal equilibrium curve 70 and the isothermal curve (**64*e*) that corresponds to the desired load current. The temperature ($T_9$) to which the junction must be raised to pass the desired load current is much greater than that of diode 15 ($T_4$ in FIGURE 4). As a result, as the diode 17 breaks down and heats the unit due to the internal power dissipation, the temperature of the device 10 increases, thereby decreasing the peak inverse voltage of diode 15 to a point wherein the applied voltage $E_1$ exceeds the peak inverse voltage of main diode 15. Once the main diode 15 breaks down, it effectively takes control and bypasses the auxiliary diode 17. Diode 15 is able to effectively bypass the auxiliary diode 17 because, for a given junction temperature, the current flowing through diode 15 is much greater than that of diode 17. In the present example, the current through diode 15 is at least thirty times greater per unit area than that of diode 17. Therefore, the operation of diode 15 at this point can be considered (as previously mentioned) disregarding any effect of the diode 17**.

What is claimed is:

1. A semiconductor device comprising:

a common semiconductor region exhibiting a low resistivity;
a first semiconductor region of an opposite conductivity type than said common semiconductor region, said first semiconductor region having a resistivity at least one hundred times as great as that of said common region and forming a first rectifying junction with said common region, said first junction exhibiting a high avalanche breakdown voltage greater than one hundred volts; and
a second semiconductor region of an opposite conductivity type than said common region, said second region having a resistivity at least ten times that of said common region and forming a second rectifying junction with said common region, said second rectifying junction exhibiting an avalanche breakdown voltage less than one hundred volts.

2. A semiconductor device comprising:
a common semiconductor region exhibiting a low resistivity;
a first semiconductor region of the opposite conductivity type than said common semiconductor region exhibiting a resistivity at least one-hundred times as great as said common region;
an intrinsic semiconductor region connecting said common semiconductor region and said first semiconductor region forming a first rectifying junction with said common semiconductor region and said first semiconductor region, said junction exhibiting a wide depletion region;
a second semiconductor region of an opposite conductivity type than said common semiconductor region exhibiting a resistivity at least ten times that of said common semiconductor region forming a second rectifying junction with said common region, said junction exhibiting a narrow depletion region; and
said second semiconductor region comprising a thin peripheral shell surrounding said first semiconductor region and said intrinsic semiconductor region other than said portions forming said first rectifying junction, said second semiconductor region providing ohmic contact to said first semiconductor region.

3. A power supply circuit comprising:
first and second input terminals for connection to an alternating current source;
first and second output terminals for connection to a load impedance;
means interconnecting said first input terminal and said first output terminal;
a diode, one lead of said diode being connected to said second input terminal for rectification of said signals;
a semiconductor device, said device having two parallel rectifying junctions, said junctions exhibiting dissimilar magnitudes of reverse bias saturation current and reverse bias breakdown voltages; and
means connecting said semiconductor device for reverse current flow through said parallel rectifying junctions in series between said other lead of said diode and said second output terminal, said rectified signals having sufficient amplitude to exceed the reverse bias breakdown voltage of only one of said rectifying junctions wherein the reverse bias saturation current flow through said one junction causes a destructive breakdown of the other of said rectifying junctions so that said other rectifying junction bypasses said one junction providing an increased reverse current flow through said other junction at an elevated junction temperature and a decrease in the reverse bias breakdown voltage across said other junction to provide a low effective direct current resistance and a substantially higher AC impedance.

4. An electrical circuit comprising:
a semiconductor device providing a pair of parallel rectifying junctions, said junctions having unequal avalanche breakdown voltage characteristics which if exceeded will cause a breakdown of said rectifying junctions;

a load impedance;

means for providing a source of pulsating direct current signals; and means connecting said semiconductor device in series with said pulsating source of signals and said load impedance for reverse current flow across said parallel rectifying junctions, said pulsating signals having an amplitude greater than that of the avalanche breakdown voltage of the first one of said parallel rectifying junctions and less than the avalanche breakdown voltage of the second one of said parallel rectifying junctions causing a temporary nondestructive breakdown of said first rectifying junction whereby the second parallel rectifying junction is heated by an increased reverse current through said first rectifying junction causing a nondestructive breakdown of said second parallel rectifying junction whereby said second rectifying junction bypasses said first rectifying junction providing an increased reverse current at an elevated junction temperature and a decreased reverse voltage drop to provide a low effective direct current resistance and a substantially higher AC impedance.

References Cited by the Examiner

UNITED STATES PATENTS

| | | | |
|---|---|---|---|
| 3,007,090 | 10/1961 | Rutz | 317—235 |
| 3,105,920 | 10/1963 | Dewey | 307—88.5 |
| 3,196,327 | 7/1965 | Dickson | 317—235 |
| 3,242,392 | 3/1966 | Hayashi et al. | 317—235 |

JOHN W. HUCKERT, *Primary Examiner.*

J. D. CRAIG, *Assistant Examiner.*